United States Patent
Song et al.

(10) Patent No.: US 11,502,241 B2
(45) Date of Patent: Nov. 15, 2022

(54) MAGNETIC DEVICE AND MAGNETIC RANDOM ACCESS MEMORY

(71) Applicant: TAIWAN SEMICONDUCTOR MANUFACTURING CO., LTD., Hsinchu (TW)

(72) Inventors: MingYuan Song, Hsinchu (TW); Shy-Jay Lin, Hsinchu County (TW); William J. Gallagher, Hsinchu (TW); Hiroki Noguchi, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 314 days.

(21) Appl. No.: 16/731,864

(22) Filed: Dec. 31, 2019

(65) Prior Publication Data
US 2021/0202827 A1 Jul. 1, 2021

(51) Int. Cl.
*H01L 43/02* (2006.01)
*H01L 43/10* (2006.01)
*G11C 11/16* (2006.01)
*H01L 43/12* (2006.01)

(52) U.S. Cl.
CPC .......... *H01L 43/02* (2013.01); *G11C 11/1655* (2013.01); *G11C 11/1657* (2013.01); *H01L 43/10* (2013.01); *H01L 43/12* (2013.01)

(58) Field of Classification Search
CPC ......... H01L 43/02; H01L 43/10; H01L 43/12; G11C 11/1655; G11C 11/1657
USPC ....................................... 257/421
See application file for complete search history.

(56) References Cited

U.S. PATENT DOCUMENTS

| | | |
|---|---|---|
| 2014/0056060 A1 | 2/2014 | Khvalkovskiy et al. |
| 2017/0077177 A1 | 3/2017 | Shimomura et al. |
| 2018/0114557 A1 | 4/2018 | Park et al. |
| 2018/0219152 A1 | 8/2018 | Apalkov et al. |
| 2019/0006415 A1 | 1/2019 | Li et al. |
| 2019/0312198 A1 | 10/2019 | Sun |
| 2019/0348329 A1 | 11/2019 | Shiokawa et al. |
| 2019/0386203 A1 | 12/2019 | Gosavi et al. |
| 2020/0136018 A1* | 4/2020 | Ying .................. H01L 43/02 |
| 2021/0134339 A1* | 5/2021 | Song .................. G11C 11/1675 |

FOREIGN PATENT DOCUMENTS

| | | |
|---|---|---|
| DE | 112015006896 T5 | 5/2018 |
| KR | 10-2014-0113428 A | 9/2014 |
| KR | 10-2017-0041749 A | 4/2017 |

(Continued)

OTHER PUBLICATIONS

Y. Seo, et al., "Area-Efficient SOT-MRAM With a Schottky Diode", IEEE Electron Device Letters, vol. 37, No. 8, Aug. 2016, pp. 982-985.

(Continued)

*Primary Examiner* — Jami Valentine Miller
(74) *Attorney, Agent, or Firm* — McDermott Will & Emery LLP

(57) ABSTRACT

A magnetic memory device includes a magnetic tunnel junction (MTJ) stack, a spin-orbit torque (SOT) induction wiring disposed over the MTJ stack, a first terminal coupled to a first end of the SOT induction wiring, a second terminal coupled to a second end of the SOT induction wiring, and a selector layer coupled to the first terminal.

20 Claims, 14 Drawing Sheets

(56) References Cited

FOREIGN PATENT DOCUMENTS

| KR | 10-2018-0044456 A | 5/2018 |
|---|---|---|
| WO | 2016/011435 A1 | 1/2016 |
| WO | 2019/005172 A1 | 1/2019 |

OTHER PUBLICATIONS

H. Yang, et al., "Threshold Switching Selector and 1S1R Integration Development for 3D Cross-point STT-MRAM", IEEE, IEDM, 2017, 4 pgs.

* cited by examiner

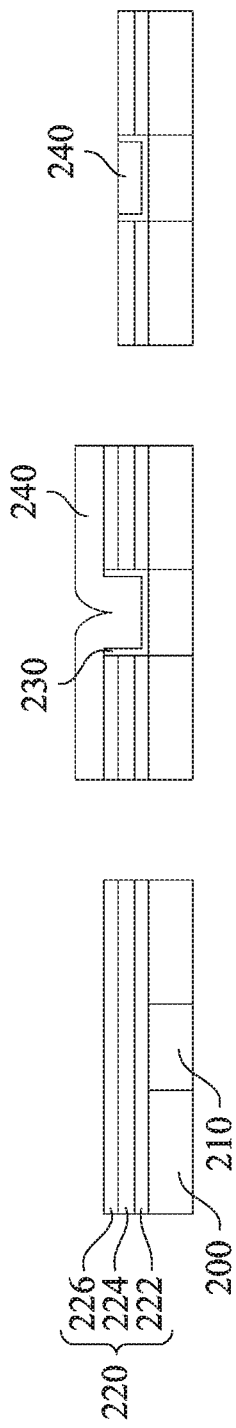
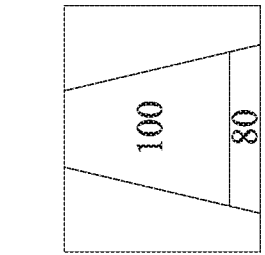
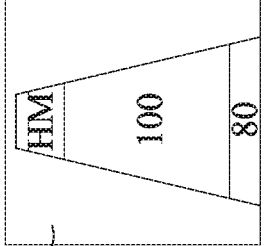
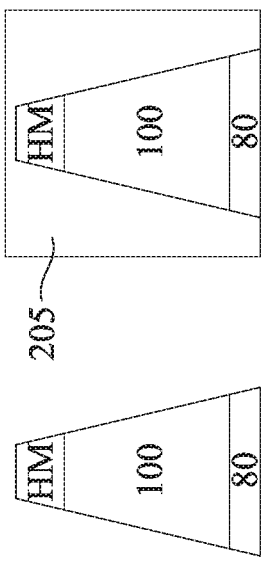
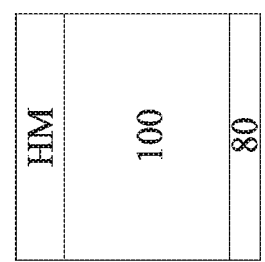
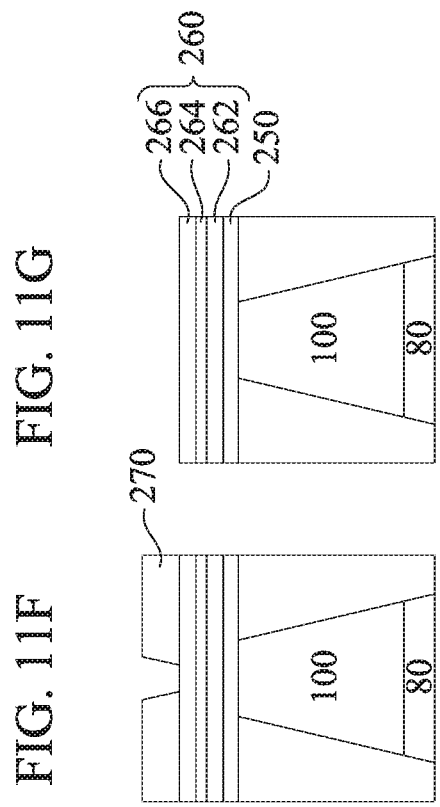
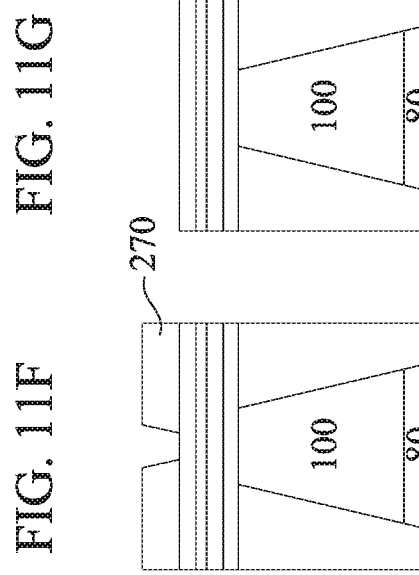
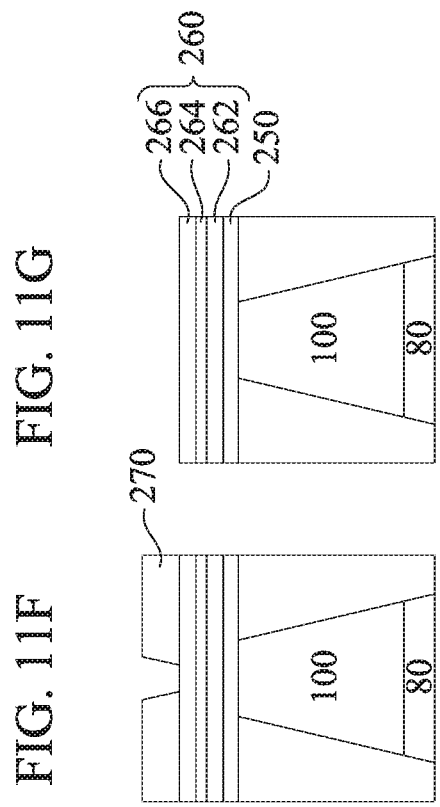
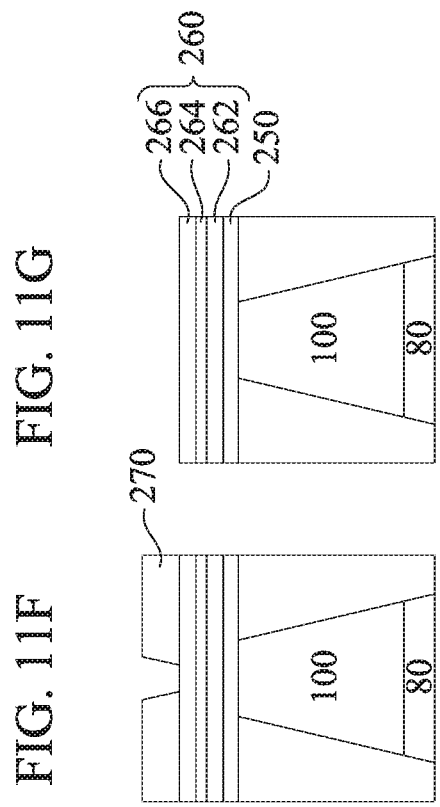

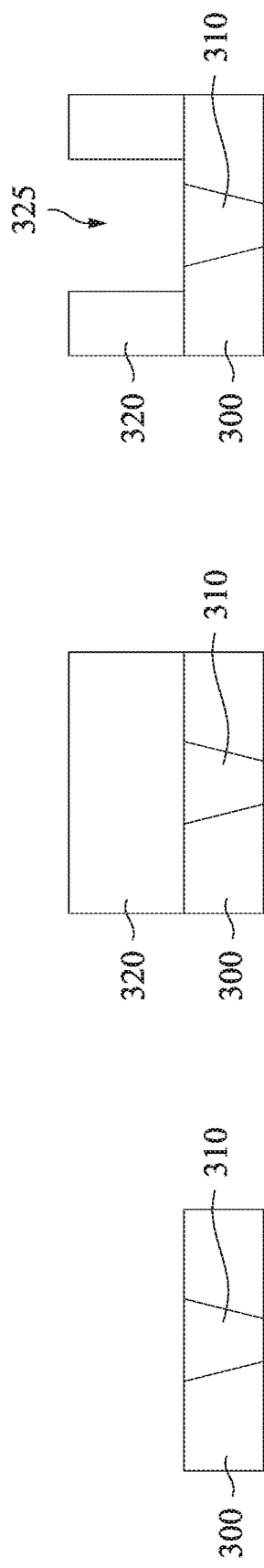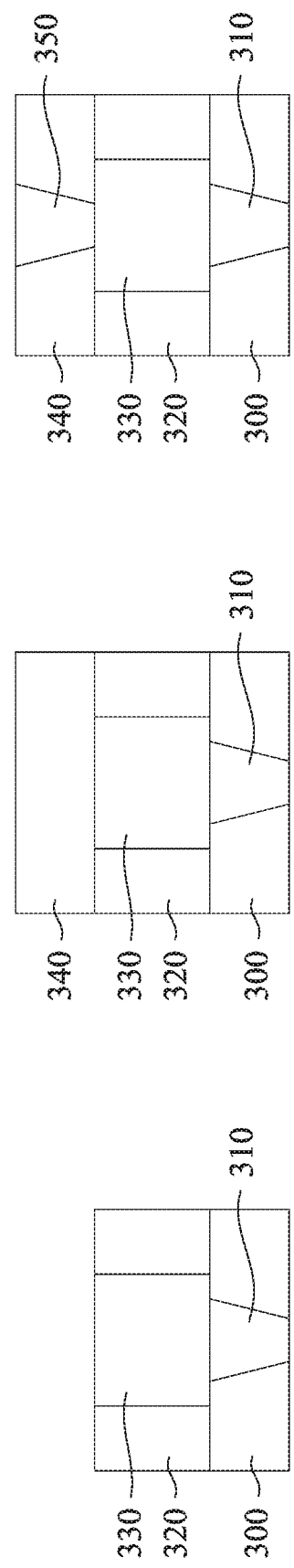

MAGNETIC DEVICE AND MAGNETIC RANDOM ACCESS MEMORY

BACKGROUND

A magnetic random access memory (MRAM) offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. One type of an MRAM is a spin transfer torque magnetic random access memory (STT-MRAM). An STT-MRAM utilizes a magnetic tunneling junction (MTJ) written at least in part by a current driven through the MTJ. Another type of an MRAM is a spin orbit torque MRAM (SOT-MRAM), which generally requires a lower switching current than an STT-MRAM.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A, 11B, 11C, 11D, 11E, 11F, 11G, 11H, 11I, 11J and 11K show a sequential manufacturing operation for an SOT-MRAM device according to the present disclosure.

FIGS. 13A, 13B, 13C, 13D, 13E and 13F show a sequential manufacturing operation for a selector material layer according to the present disclosure.

DETAILED DESCRIPTION

Figure 1:
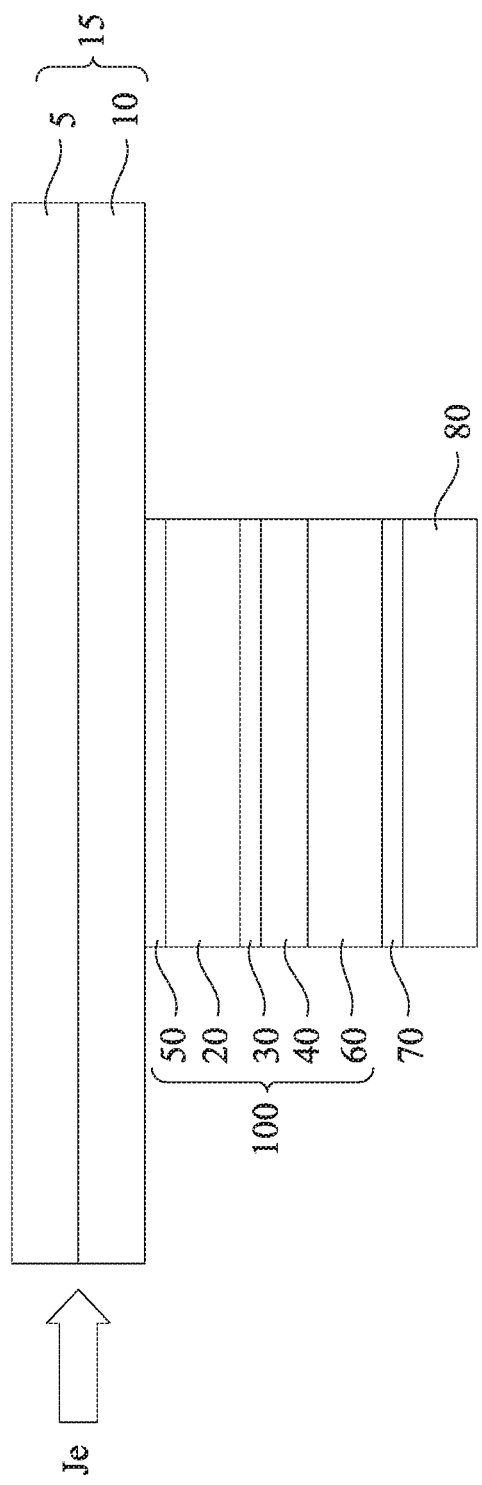
FIG. 1 is a schematic view of an SOT-MRAM cell according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations described with respect to one embodiment may be employed in the other embodiments, and detailed explanation thereof may be omitted.

A spin-torque-transfer magnetic random access memory (STT MRAM), is one of the next generation technologies for CMOS integrated circuits (ICs) that require a memory, due to its non-volatile nature, compatibility with Si-CMOS technology, fast read and write speed, high data endurance and retention, a relative small bit-cell size, as well as environmental robustness. A high-value emerging application for a STT MRAM is a low-level cache for a central processing unit (CPU) or a micro control unit (MCU), which offers the attractive benefit of system speed boost and faster turn-on due its non-volatility. However, this application puts a strenuous requirement on the memory's speed, more specifically on write speed which is much slower than read speed. The cache application for a CPU and/or an MCU additionally requires low-power consumption, which is hard for a STT MRAM, because it takes substantial current to change the magnetization state during the write operation. In current STT MRAM art, write speed improvement via a film stack and write scheme optimization and write current reduction via stack optimization and critical dimension (CD) reduction may be stalled due to inevitable performance trade-offs in endurance and retention. Novel ideas, like a high frequency-assisted write operation, have been proposed, which may not be feasible. There is a significant gap between the best reported STT MRAM write speed and current and those required by cache applications, which could amount to a show stopper.

An STT-MRAM cell generally includes a magnetic tunnel junction (MTJ) film stack having a free magnetic layer, a reference or pinned magnetic layer and a tunnel barrier layer made of a non-magnetic material, such as MgO. The magnetization of the magnetic layers can be either in-plane or perpendicular to the plane. The free layer is the magnetic layer which has two energetically equivalent magnetic states, with the magnetization in the free layer parallel or antiparallel to the magnetization of the reference layer. By applying a current perpendicular to the MTJ film stack, the magnetic orientation (moment) of the free magnetic layer can be changed, thereby writing data to the STT-MRAM cell.

In contrast, spin-orbital-transfer (or spin-orbital-torque) (SOT) magnetic switching is an emerging write concept that has the potential to provide order-of-magnitude improvement on write current and speed. SOT is considered as a solution for high-speed, low power cache application.

In an SOT-MRAM, the magnetic moment of the free magnetic layer is switched using the spin-orbit interaction effect caused by a current flowing parallel to the MTJ film stack. The magnetic moment of the free magnetic layer is switched using only the spin-orbit interaction effect, or the magnetic moment of the free magnetic layer is switched using a combination of effects. However, an SOT device structure is a three terminal device and generally requires two switching transistors (a 2T1R (two transistors-one resistor) structure), and thus an SOT-MRAM has a low cell density.

In the present disclosure, a 1T1S1R (one transistor, one selector and one resistor) SOT-MRAM design is proposed, which can reduce a device foot print (cell size), reduce magnetic resistance and increase cell density.

FIG. 1 is a schematic view of an SOT-MRAM cell according to an embodiment of the present disclosure.

The SOT-MRAM device includes an SOT induction wiring layer 15, as a spin-orbit interaction active layer, formed over a MTJ film stack 100. The MTJ film stack 100 includes a first magnetic layer 20, which is a free magnetic layer or a data storage layer, disposed under the SOT induction wiring layer 15, a nonmagnetic spacer layer 30 disposed under the first magnetic layer 20, and a second magnetic layer 40, as a reference layer, disposed under the nonmagnetic spacer layer 30. In some embodiments, an interface layer 50, as a keeper layer, is disposed disclosed between the SOT induction wiring layer 15 and the first magnetic layer 20. Further, the MTJ film stack 100 includes a third magnetic layer 60, as a hard bias layer, disposed under the second magnetic layer 40. In some embodiments, a bottom electrode layer 80 is disposed under the MTJ film stack 100. In some embodiments, a seed layer 70 is formed on the bottom electrode layer 80. In some embodiments, an antiferromagnetic layer, for example a Ru layer, is disposed between the second magnetic layer 40 and the third magnetic layer 60. Further, in some embodiments, the SOT induction wiring layer 15 includes a top conductive layer 5, e.g., a top electrode, disposed on a main SOT induction wiring layer 10. In the present disclosure, the bottom electrode layer 80 (and the seed layer 70) is not a part of the MTJ film stack 100. However, it is possible to consider the bottom electrode layer 80 and/or the seed layer as a part of the MTJ film stack 100.

The magnetic moment of the free layer 20 (first magnetic layer) is switched using the spin-orbit interaction effect. In some embodiments, the magnetic moment of the first magnetic layer 20 is switched using only the spin-orbit interaction effect. In other embodiments, the magnetic moment of the first magnetic layer 20 is switched using a combination of effects. For example, the magnetic moment of the first magnetic layer 20 is switched using spin transfer torque as a primary effect that may be assisted by torque induced by the spin-orbit interaction. In other embodiments, the primary switching mechanism is torque induced by the spin-orbit interaction. In such embodiments, another effect including, but not limited to, spin transfer torque, may assist in switching.

The main SOT induction wiring layer 10 is a spin orbit active layer that has a strong spin-orbit interaction and that can be used in switching the magnetic moment of the first magnetic layer 20. The main SOT induction wiring layer 10 is used in generating a spin-orbit magnetic field H. More specifically, a current driven in a plane through the main SOT induction wiring layer 10 and the attendant spin-orbit interaction may result in the spin-orbit magnetic field H. This spin orbit magnetic field H is equivalent to the spin-orbit torque T on magnetization, where $T=-\gamma[M \times H]$ in the first magnetic layer 20. The torque and magnetic field are thus interchangeably referred to as spin-orbit field and spin-orbit torque. This reflects the fact that the spin-orbit interaction is the origin of the spin-orbit torque and spin-orbit field. Spin-orbit torque occurs for a current driven in a plane in the main SOT induction wiring layer 10 and a spin-orbit interaction. In contrast, spin transfer torque is due to a perpendicular-to-plane current flowing through the first magnetic layer 20, the nonmagnetic spacer layer 30 and the second magnetic layer 40 (reference layer), that injects spin polarized charge carriers into the first magnetic layer 20. The spin-orbit torque T may rapidly deflect the magnetic moment of the first magnetic layer 20 from its equilibrium state parallel to the easy axis. The spin-orbit torque T may tilt the magnetization of the first magnetic layer 20 considerably faster than conventional STT torque of a similar maximum amplitude. In some embodiments, switching can be completed using spin-orbit torque. In other embodiments, another mechanism such as spin transfer may be used to complete switching. The spin-orbit field/spin-orbit torque generated may thus be used in switching the magnetic moment of the first magnetic layer 20.

In some embodiments, the interaction of the main SOT induction wiring layer 10 includes the spin Hall effect. For the spin Hall effect, a current Je is driven in the plane of the main SOT induction wiring layer 10 (i.e., current-in-plane, substantially in the x-y plane in FIG. 1). In other words, the current Je is driven perpendicular to the stacked direction of the films including the main SOT induction wiring layer 10 and the first magnetic layer 20 (i.e., perpendicular to the normal to the surface, the z-direction in FIG. 1). Charge carriers having spins of a particular orientation perpendicular to the direction of current and to the normal to the surface (z-direction) accumulate at the surfaces of the SOT induction wiring layer 10. A majority of these spin-polarized carriers diffuse into the first magnetic layer 20 (free layer). This diffusion results in the torque T on the magnetization of the first magnetic layer 20. Since torque on the magnetization is equivalent to the effective magnetic field on the magnetization, as set forth above, the spin accumulation equivalently results in the field H on the first magnetic layer 20. The spin-orbit field for the spin-Hall effect is the cross product of the spin-orbit polarization and the magnetic moment of the first magnetic layer 20. As such, the magnitude of the torque is proportional to the in-plane current density Je and spin polarization of the carriers. The spin-Hall effect may be used in switching the magnetic stacked layer shown in FIG. 1 when the polarization induced by the spin-Hall effect is parallel to the easy axis of the first magnetic layer 20. To obtain the spin-orbit torque T, the current pulse is driven in plane through the SOT induction wiring layer 10. The resulting spin-orbit torque T counteracts damping torque, which results in the switching of the magnetization of the first magnetic layer 20 in an analogous manner to conventional STT switching.

As set forth above, the main SOT induction wiring layer 10 is a spin orbit active layer that causes a strong spin orbit interaction with the first magnetic layer 20 (free layer). In some embodiments, the main SOT induction wiring layer 10 includes one or more heavy metals or materials doped by heavy metals. In certain embodiments, Pt, α-W, β-W, Mo, Ru and/or β-Ta is used as the SOT induction wiring layer 10. A thickness of the main SOT induction wiring layer 10 is in a range from about 2 nm to 20 nm in some embodiments and is in a range from about 5 nm to 15 nm in other embodiments. In some embodiments, an antiferromagnetic layer made of, for example, IrMn, is disposed between the main SOT induction wiring layer 10 and the top conductive layer 5. In other embodiments, instead of the heavy metal layer, the antiferromagnetic layer (e.g., IrMn) is used as the SOT induction wiring layer 10.

The first magnetic layer 20, as a data storage layer, is a free layer having a magnetic moment that is switchable. In some embodiments, the first magnetic layer 20 is a cobalt iron boron (CoFeB) layer, a cobalt/palladium (CoPd) layer and/or a cobalt iron (CoFe) layer, having a thickness in a range from about 0.6 nm to about 1.2 nm in some embodiments. In certain embodiments, the first magnetic layer 20 is $Fe_xCo_yB_{1-x-y}$, where $0.50 \le x \le 0.70$ and $0.10 \le y \le 0.30$. In other embodiments, $0.55 \le x \le 0.65$ and $0.15 \le y \le 0.25$. In some embodiments, the free layer 20 (a storage layer) is either perpendicular magnetic anisotropic (PMA) or in-plane magnetic anisotropic (IMA). The spin polarization can be controlled by changing the thickness of the free layer 20. In some embodiments, when the thickness of a free layer made of, e.g., CoFeB, is smaller than about 1.3 nm, the free layer 20 is PMA, and when the thickness is greater than about 1.3 nm, the free layer 20 is IMA.

The nonmagnetic spacer layer 30 is made of a dielectric material, and functions as a tunneling barrier. In some embodiments, the nonmagnetic spacer layer 30 includes a crystalline or an amorphous magnesium oxide (MgO) layer. In other embodiments, the nonmagnetic spacer layer 30 is made of aluminum oxide or a conductive material, such as Cu. In some embodiments, the nonmagnetic spacer layer 30 has a thickness in a range from about 0.3 nm to about 3 nm, and in other embodiments, the thickness of the nonmagnetic layer 30 is in a range from about 0.5 nm to about 1.0 nm. In this disclosure, an "element layer" or a "compound layer" generally means that the content of the element or compound is more than 99%.

The second magnetic layer 40 is a reference layer of which the magnetic moment does not change. In some embodiments, the second magnetic layer 40 is made of the same material as the first magnetic layer 20 as set forth above. In some embodiments, the second magnetic layer 40 includes one or more layers of magnetic materials. In some embodiments, the second magnetic layer 40 includes a layer of cobalt (Co), iron (Fe) and boron (B) or includes a layer of Fe and B. In some embodiments, a thickness of the second magnetic layer 40 is in a range from about 0.2 nm to about 2.5 nm and is in a range from about 1.0 nm to about 1.5 nm in other embodiments.

The third magnetic layer 60 is a hard bias layer of which the magnetic moment does not change. In some embodiments, the third magnetic layer 60 includes a multilayer structure of cobalt (Co) and platinum (Pt). In some embodiments, a thickness of the third magnetic layer 60 is in a range from about 0.2 nm to about 2.0 nm and is in a range from about 0.3 nm to about 1.0 nm in other embodiments.

In some embodiments, the seed layer 70 includes Ta. In some embodiments, the bottom electrode layer 80 includes Ti, TiN, Ta and/or TaN. In some embodiments, a CoHf buffer layer is disposed between the third magnetic layer 60 and the bottom electrode layer 80.

The top conductive layer 5 is an electrode that includes one or more layers of Ta, TiN, TaN, Ru, Au, and Al.

The interface layer 50 includes at least one of an MgO layer and a Co layer in some embodiments. The interface layer 50 can minimize the magnetic interference between the first magnetic layer 20 and the SOT induction wiring layer 10, while maintaining magnetic coupling thereof.

Figure 2:
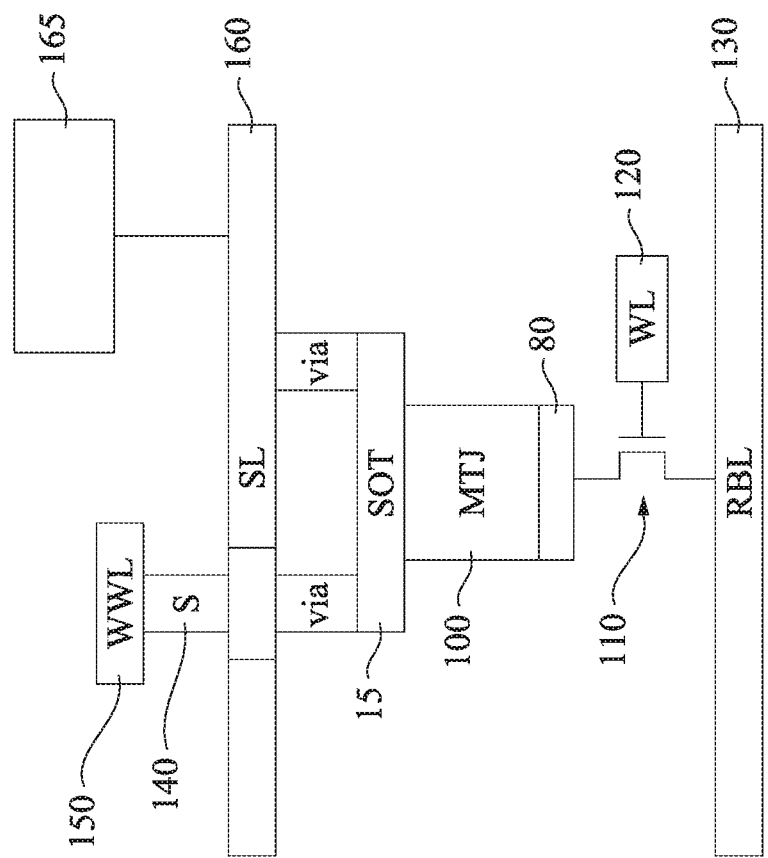
FIG. 2 is a schematic view of an SOT-MRAM cell according to an embodiment of the present disclosure.

FIG. 2 shows a schematic view of an SOT-MRAM cell according to an embodiment of the present disclosure. Materials, configurations, dimensions, processes and/or operations described with respect to FIG. 1 may be employed in the following embodiments, and detailed explanation thereof may be omitted.

In some embodiments, the bottom electrode layer 80 is coupled to a switching device (e.g., a field effect transistor (FET)) 110. In some embodiments, the bottom electrode layer 80 is coupled to a drain (or source) of the FET 110 through one or more conductive patterns, such as a via, a wiring and/or a pad, and a gate of the FET is coupled to a first word line (WL) 120. A source (or drain) of the FET 110 is coupled to a bit line (e.g., read bit line RBL) 130 through one or more conductive patterns, such as a via, a wiring and/or a pad.

In some embodiments, the SOT induction wiring layer 15 is disposed over the MTJ films stack along the vertical direction (film stack direction) (Z direction). One end of the SOT induction wiring 15 is coupled to the bottom of a selector material layer 140 through one or more conductive patterns, such as a via, a wiring and/or a pad. The other end of the SOT induction wiring 15 is coupled to a source line (SL) 160 through one or more conductive patterns, such as a via, a wiring and/or a pad. The source line 160 is coupled to a current source circuit 165 in some embodiments. The top of the selector material layer 140 is coupled to a second word line 150 (e.g., write word line) through one or more conductive patterns, such as a via, a wiring and/or a pad.

The selector material layer 140 is a switching device used to reduce or avoid leakage current from an operating memory cell or from other memory cells passing along the resistive network. In some embodiments, the selector material 140 is an ovonic threshold switching (OTS) material, which is an amorphous material.

In some embodiments, the selector material layer 140 includes one or more selected from the group consisting of GeSe doped with one or more selected from the group consisting of N, P, S, Si and Te; AsGeSe doped with one or more selected from the group consisting of N, P, S, Si and Te; and AsGeSeSi doped with one or more selected from the group consisting of N, P, S, Si and Te. In certain embodiments, the selector material layer 140 is a chalcogenide or a solid-electrolyte material containing one or more of Ge, Sb, S, and Te. In other embodiments, the selector material layer 140 is made of a material including $SiO_x$, $TiO_x$, $AlO_x$, WOE, $Ti_xN_yO_z$, $HfO_x$, $TaO_x$, $NbO_x$, or the like, or suitable combinations thereof, where x, y and z are non-stoichiometric values. In some embodiments, the selector material layer 140 includes an oxygen deficient transition metal oxide. In certain embodiments, the selector material layer 140 is made of a material including $HfO_x$, where $0<x<2$. In some embodiments, the thickness of the selector material layer 140 is in a range from about 2 nm to about 20 nm and is in a range from about 5 nm to about 15 nm in other embodiments.

Figure 3:
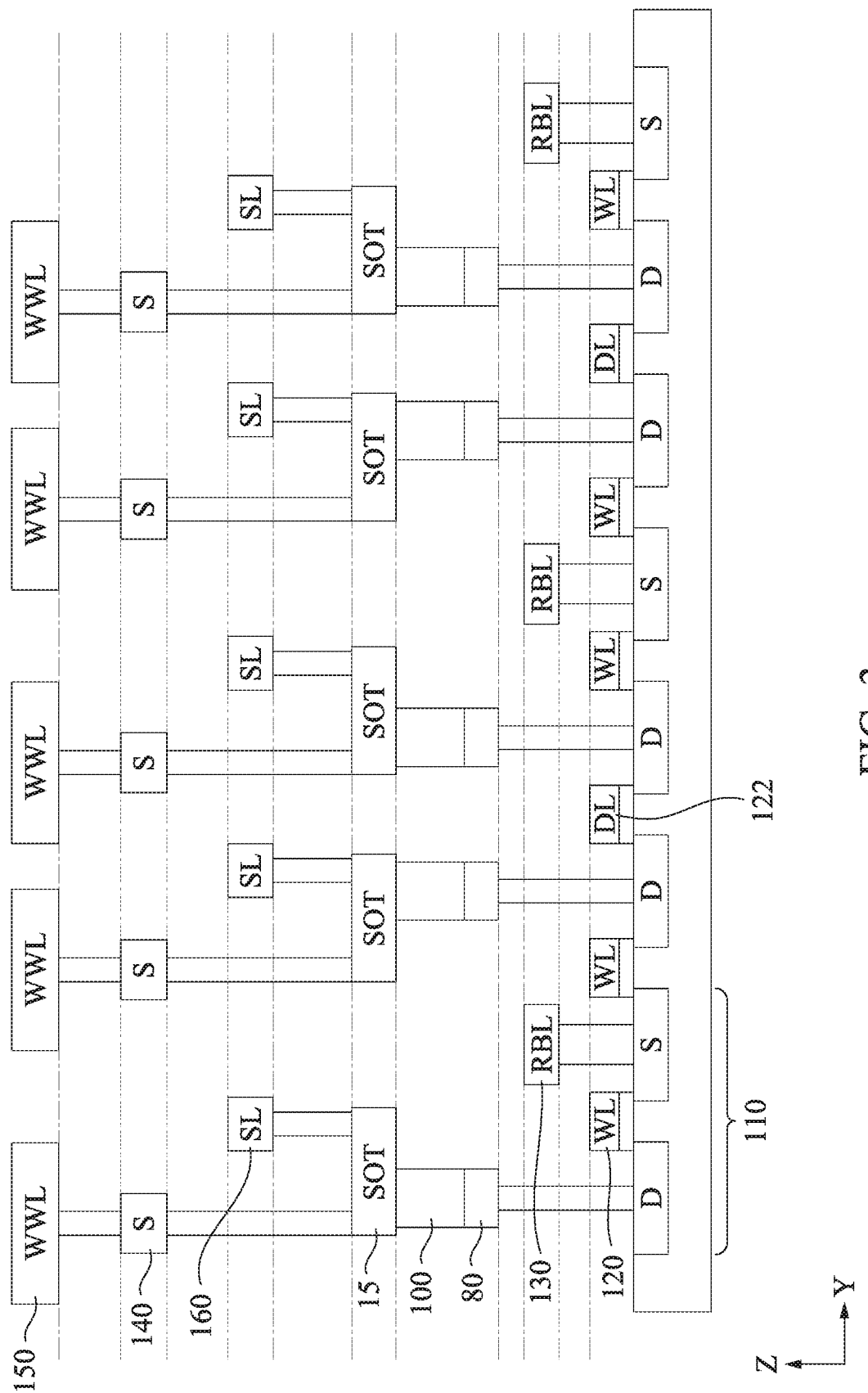
FIG. 3 is a schematic view of an SOT-MRAM device according to an embodiment of the present disclosure.

FIG. 3 is a schematic cross sectional view of an SOT-MRAM device according to an embodiment of the present disclosure. Materials, configurations, dimensions, processes and/or operations described with respect to FIGS. 1 and 2 may be employed in the following embodiments, and detailed explanation thereof may be omitted.

In some embodiments, the SOT-MRAM device includes a layered structure having a multiple wiring layer structure. In some embodiments, the multiple wiring layer structure includes "Mx" (x=0, 1, 2, 3, . . . ) metal wiring layers, which are located at respective levels disposed over a substrate, and "Vy" (y=0, 1, 2, 3, . . . ) vias (contacts) connecting the My metal wiring layer to the My+1 metal wiring layer. In some embodiments, the even-number metal wiring layers extend in one direction (e.g., X) and the odd-numbered metal wiring layers extend in another direction (e.g., Y) crossing the one direction. In some embodiments, pitches for metal wirings in M3 and M4 are the same and pitches for the metal wirings in M5 or higher are the same and are larger than the pitches for the metal wirings in M3 and M4. The adjacent metal wiring layers are separated by one or more interlayer dielectric (ILD) layers and the via is disposed in the ILD layers. In some embodiments, the metal wirings and vias are made of one or more of Al, Cu, a Cu alloy, W, Ti, TiN, Ta, TaN or any suitable conductive materials. In some embodiments, the ILD layers are made of one or more dielectric materials, such as silicon oxide, SiOC, SiOCN, SiCN, or any other suitable material.

In some embodiments, the bit line 130 is disposed on an M1 metal wiring layer which is a lowest metal wiring layer above FETs 110. In some embodiments, the bottom electrode layer 80 and/or the MTJ film stack 100 are located at an M2 metal wiring layer, which is above the bit line 130. In some embodiments, the SOT induction wiring 15 is located at an M3 metal wiring layer. In some embodiments, the selector material layer 140 is located at an M3 or an M4 metal wiring layer. In some embodiments, the source line 160 is located at the same metal wiring layer as the selector material layer 140. In other embodiments, the source line 160 is located at a lower metal wiring layer than the selector material layer 140. In some embodiments, the second word line (write word line (WWL)) 150 is located above the source line 160 and the selector material layer 140 and is located at M4, M5 or M6 metal wiring layers. In other embodiments, the source line 160 is located between the selector material layer 140 and the second word line 150.

In some embodiments, the FET 110 is a planar FET, a fin FET or a gate-all-around FET. As shown in FIG. 3, the bottom electrode layer 80 is coupled to a drain of an FET 110 and a source of the FET 110 is coupled to the bit line 130. In some embodiments, the source is shared by two adjacent FETs 110 as shown in FIG. 3. In some embodiments, a pair of FETs 110 sharing the source is separated by a dummy gate structure 122 from another pair of FETs sharing a source.

Figure 4:
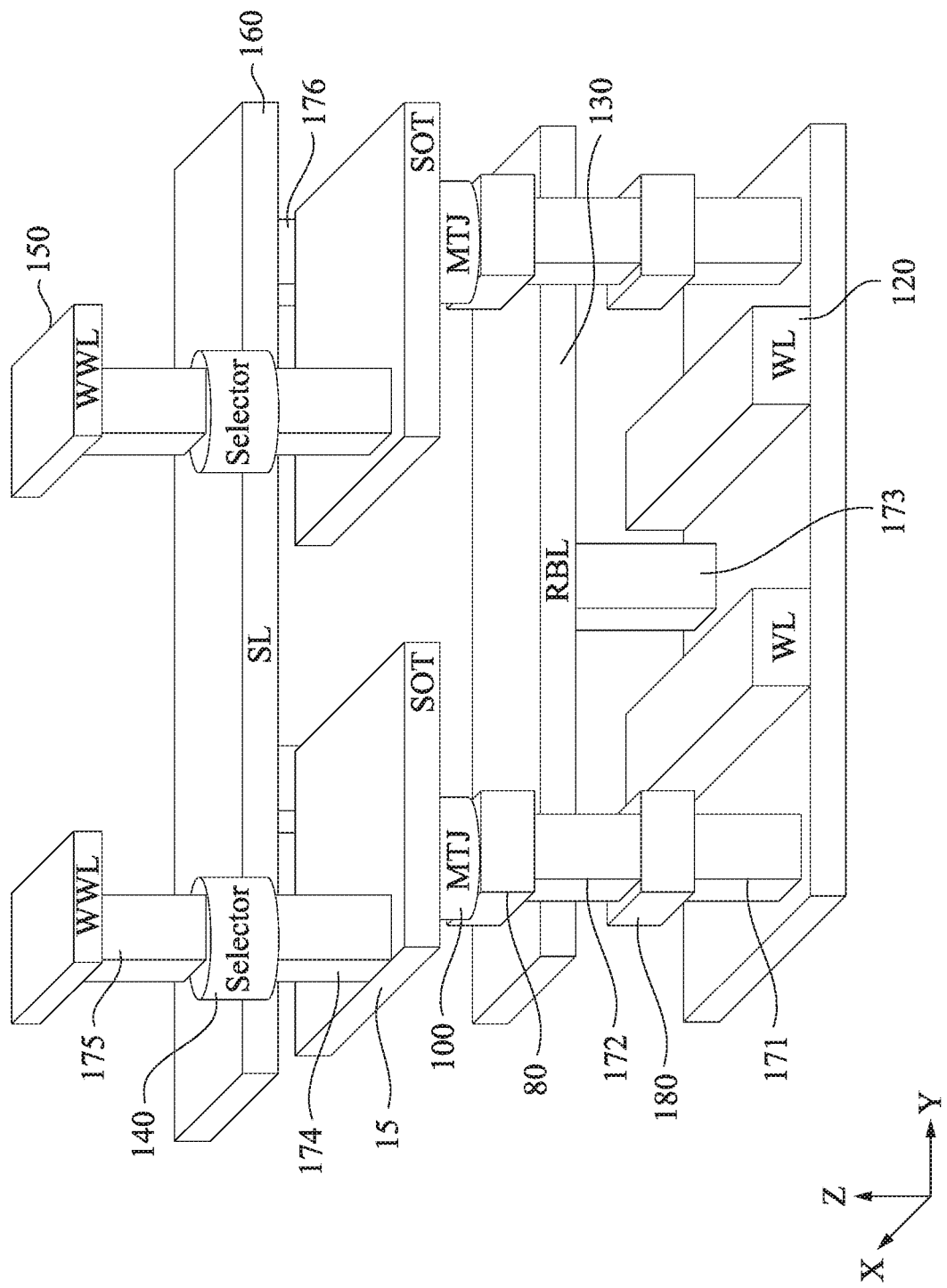
FIG. 4 is a schematic view of SOT-MRAM cells according to an embodiment of the present disclosure.

FIG. 4 is a three-dimensional schematic view of an SOT-MRAM device according to an embodiment of the present disclosure. Materials, configurations, dimensions, processes and/or operations described with respect to FIGS. 1-4 may be employed in the following embodiments, and detailed explanation thereof may be omitted.

In some embodiments, a first word line 120 (a gate of an FET) extends in the X direction and a bit line 130 extends in the Y direction. The bit line 130 is located above the first word line 120 and coupled to the source of the FET by a via 173 made of a conductive material. The bottom electrode layer 80 is coupled to the drain of the FET by a via 171, a conductive pad 180 and a via 172 in some embodiments. In some embodiments, the conductive pad 180 is located at the same level as and made of the same material as the bit line 130. In some embodiments, the via 171 and the via 173 are made of the same material.

As shown in FIG. 4, the MTJ film stack 100 is disposed over the bottom electrode layer 80 and the SOT induction wiring 15 is disposed over the MTJ film stack 100. The one end of the SOT induction wiring 15 is coupled to the bottom of the selector material layer 140 by a via 174 and the other end of the SOT induction wiring 15 is coupled to the source line 160 by a via 176 in some embodiments. In some embodiments, the via 174 and via 176 are made of the same material. In some embodiments, the height of the via 174 is the same as the height of the via 176. In other embodiments, the height of the via 174 is smaller or larger than the height of the via 176. In some embodiments, the selector material layer 140 is disposed over a bottom electrode (not shown) formed on the via 174. In such a case, the bottom electrode is made of the same material as the source line 160 in some embodiments. In some embodiments, the source line 160 extends in the Y direction.

Further, as shown in FIG. 4, the second word line 150 is disposed over the selector material layer 140 and the source line 160. In some embodiments, the second word line extends in the X direction. The second word line 150 is coupled to the top of the selector material layer 140 by a via 175. In some embodiments, a top electrode (not shown) is formed on the top of the selector material layer 140 and the via 175 is connected to the top electrode. In this embodiment, the SOT induction wiring 15 extends in the Y direction and the vias 174 and 176 are arranged such that the SOT current flows along the Y direction or across the SOT induction wiring 15.

Figure 5:
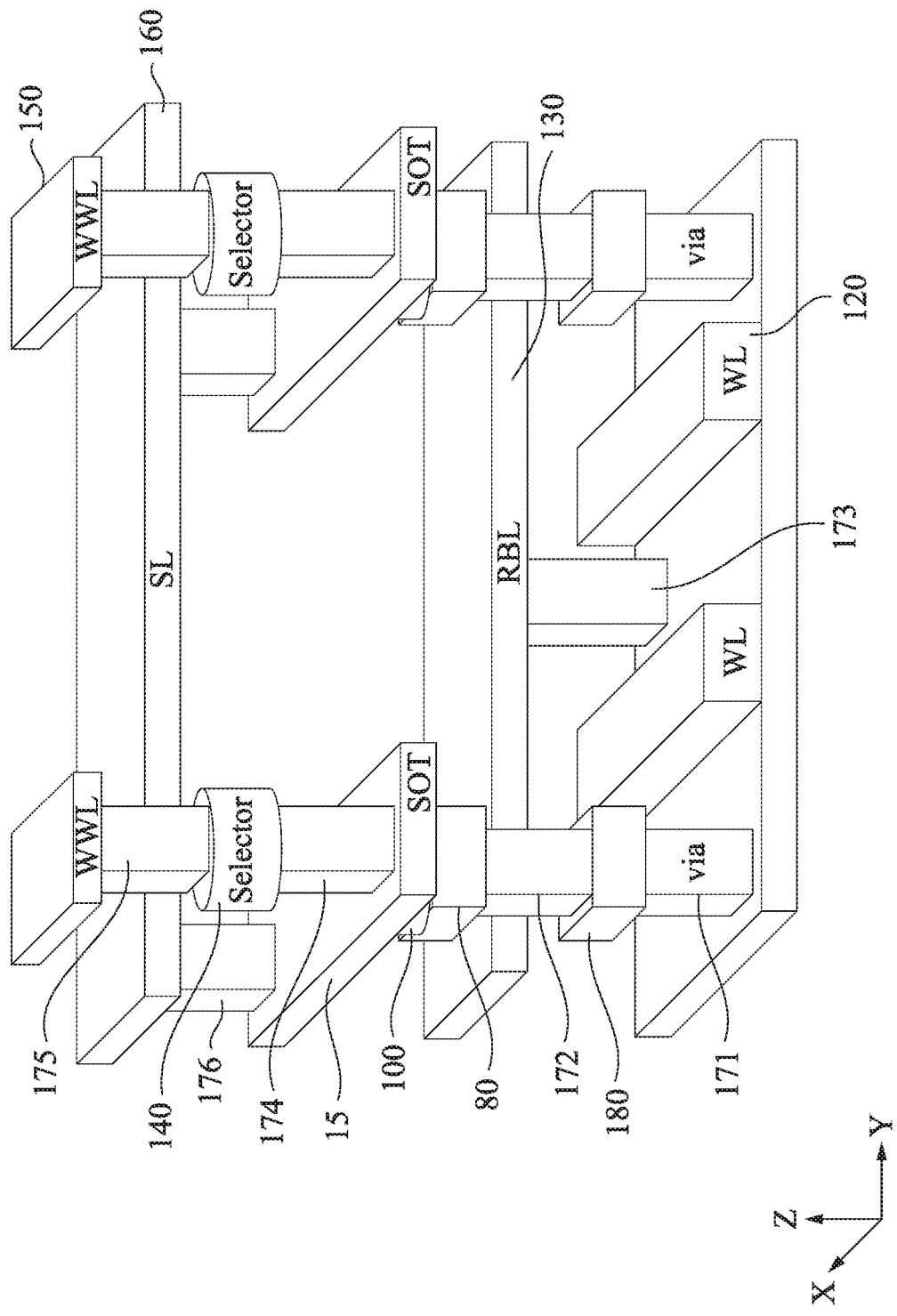
FIG. 5 is a schematic view of SOT-MRAM cells according to an embodiment of the present disclosure.

FIG. 5 is a three-dimensional schematic view of an SOT-MRAM device according to another embodiment of the present disclosure. The configuration of the SOT-MRAM shown in FIG. 5 is substantially the same as the configuration of the SOT-MRAM shown in FIG. 4, except for the configuration of the SOT induction wiring 15 and the source line 160. In this embodiment, the SOT induction wiring 15 extends in the X direction and the vias 174 and 176 are arranged such that the SOT current flows along the X direction. The source line 160 extends in the Y direction and is connected to the SOT induction wiring 15 by the via 176.

Figure 6:
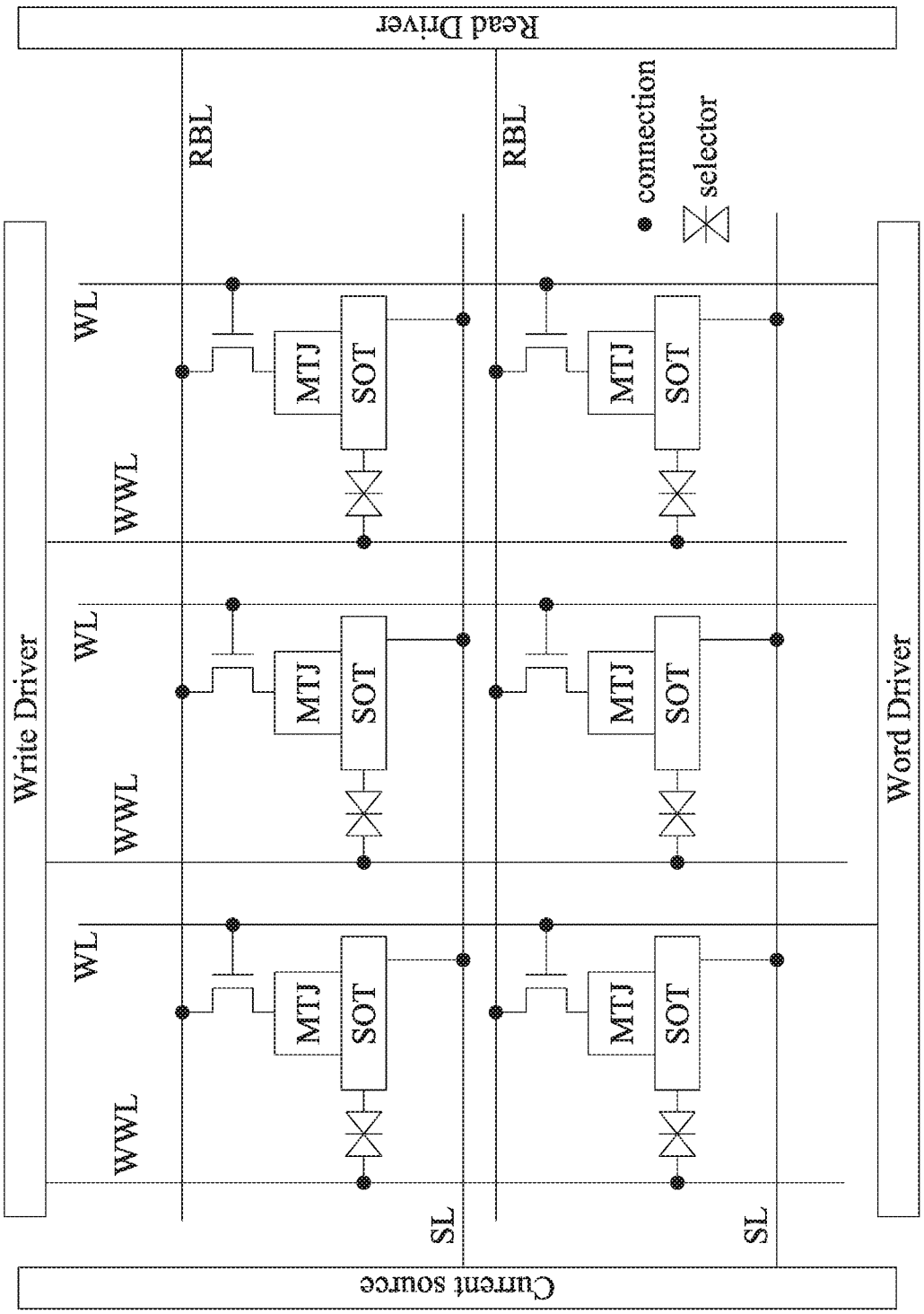
FIG. 6 is a circuit diagram of an SOT-MRAM device according to an embodiment of the present disclosure.

FIG. 6 is a circuit diagram of an SOT-MRAM device according to an embodiment of the present disclosure. Materials, configurations, dimensions, processes and/or operations described with respect to FIGS. 1-5 may be employed in the following embodiments, and detailed explanation thereof may be omitted.

In some embodiments, bit lines, for example read bit lines RBL, and source lines SL, both extend in a row direction, and first word line WL and second word line (write word line) WWL extend in a column direction. SOT-MRAM cells are disposed at locations defined by a read bit line RBL, a write word line WWL, a word line WL and a source line SL in some embodiments. The number of memory cells coupled to the same word lines and/or the same bit lines is not limited to two or three and can be more than 3, e.g., 4, 8, 16, 32, 64, 128, 256, 512 or 1024 or more. The word lines WL are coupled to a word driver circuit (row decoder), the source lines SL are coupled to a current source circuit, the read bit lines RBL are coupled to a read driver circuit (read circuit or column decoder) and the write word lines WWL are coupled to a write driver circuit (write circuit or row decoder). One end of the SOT induction wiring 15 (SOT) is coupled to a corresponding source line SL, and the other end of SOT induction wiring SOT is coupled to a corresponding write word line WWL through a selector. One end of the MTJ film stack MTJ is coupled to a corresponding read bit line through an FET, of which the gate is coupled to a corresponding word line.

Figure 7:
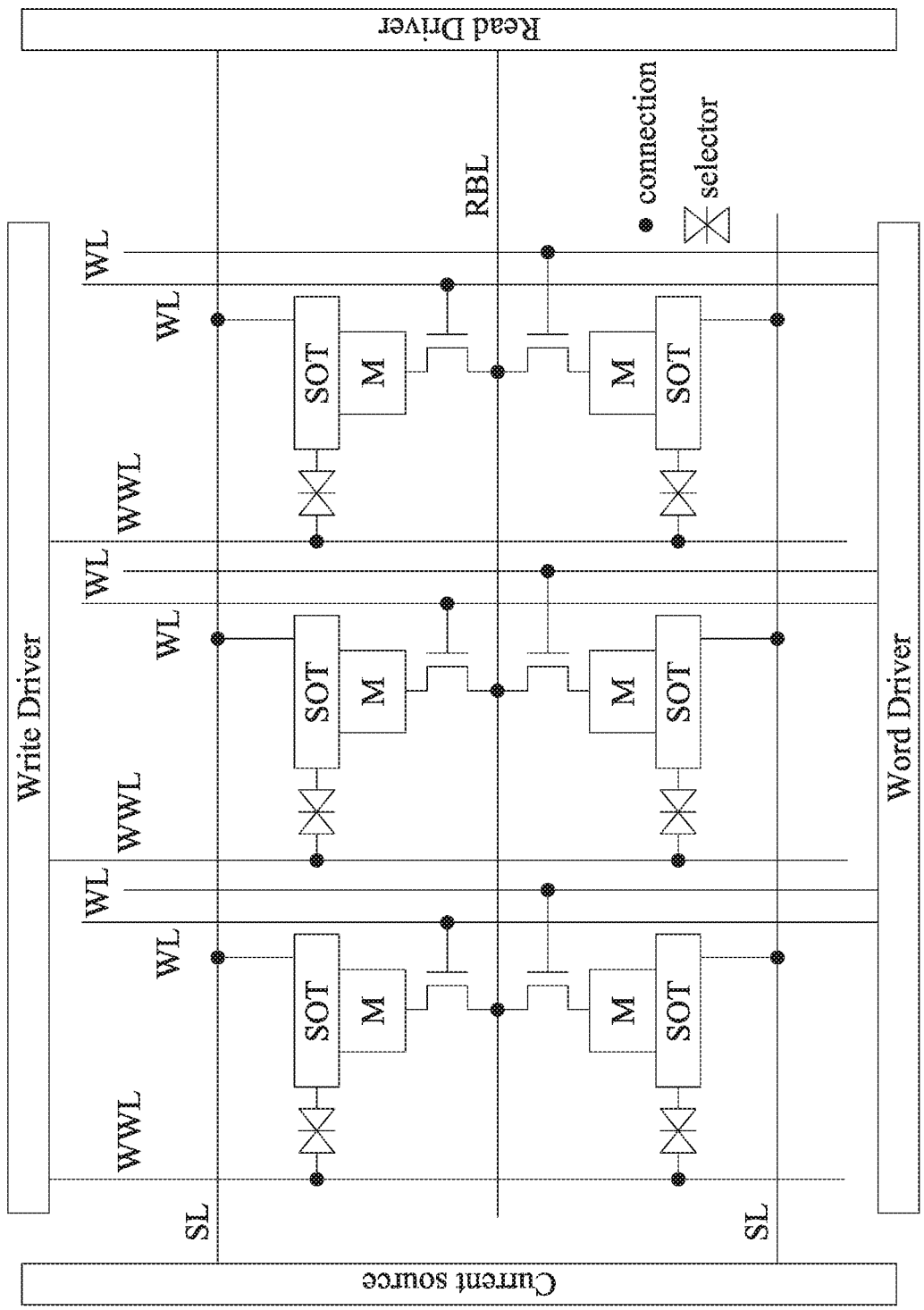
FIG. 7 is a circuit diagram of an SOT-MRAM device according to an embodiment of the present disclosure.

FIG. 7 is a circuit diagram of an SOT-MRAM device according to another embodiment of the present disclosure. Materials, configurations, dimensions, processes and/or operations described with respect to FIGS. 1-6 may be employed in the following embodiments, and detailed explanation thereof may be omitted.

In this embodiment, adjacent MRAM cells along the column direction are coupled to the same read bit line RBL and coupled to two different word lines WL. Compared with the configuration of FIG. 6, the circuit of FIG. 7 can decrease the cell size in the column direction.

Figure 8:
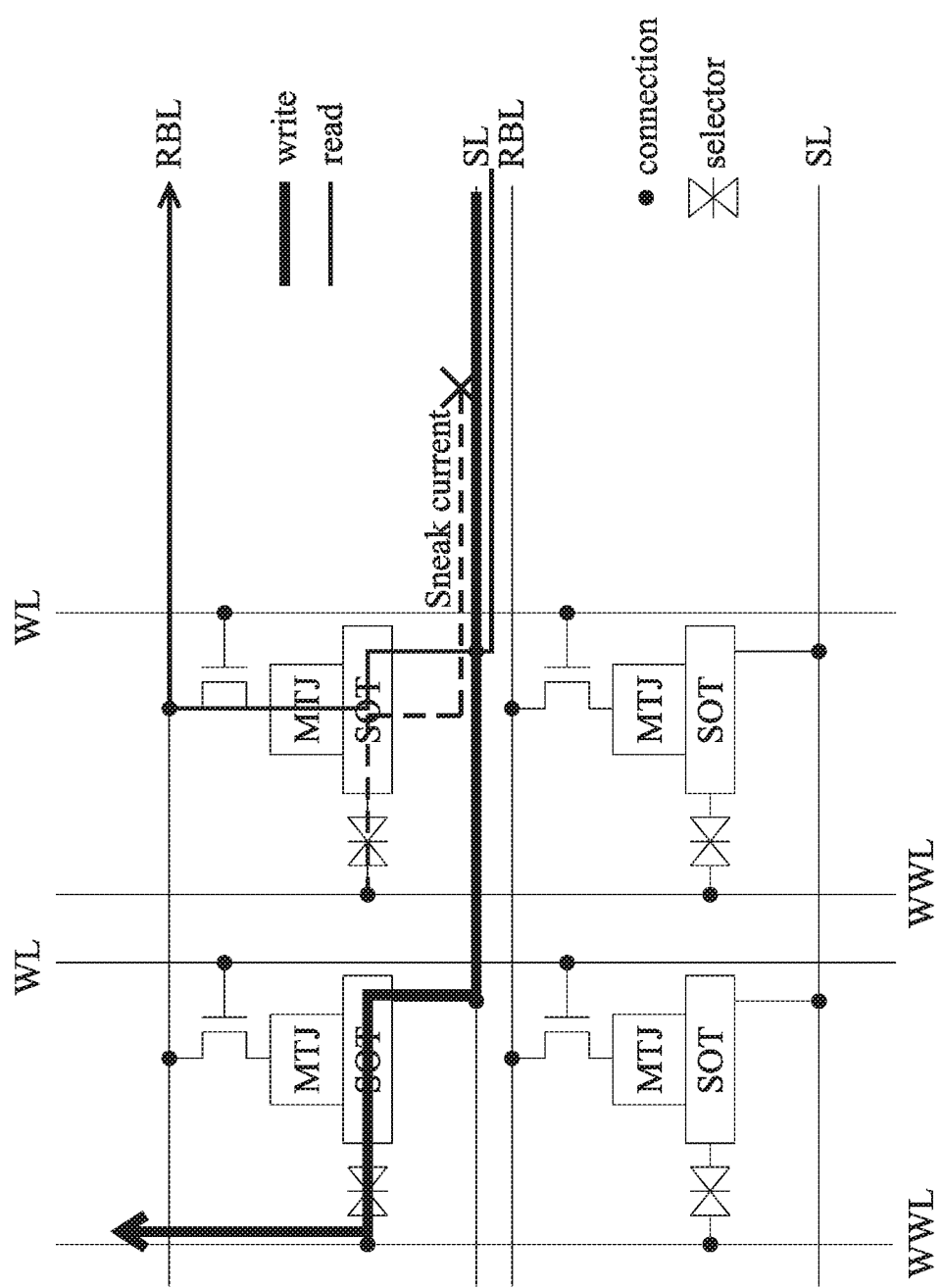
FIG. 8 shows operations of an SOT-MRAM cell according to an embodiment of the present disclosure.
Figure 9:
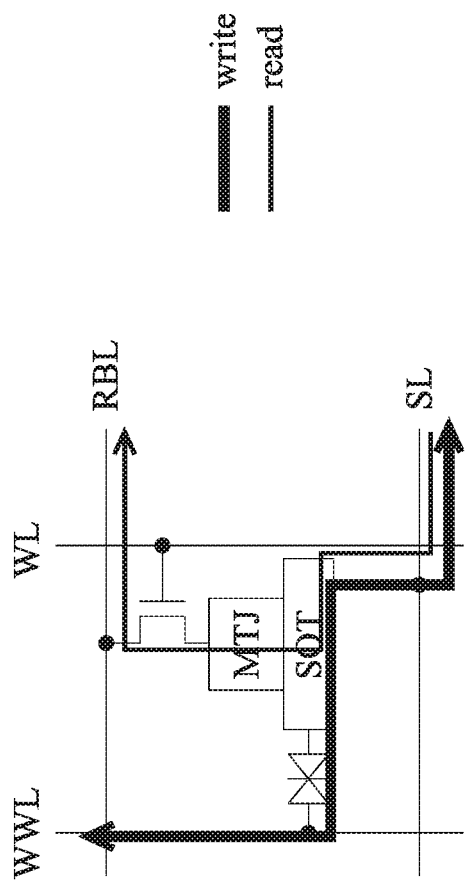
FIG. 9 shows operations of an SOT-MRAM cell according to an embodiment of the present disclosure.

FIGS. 8 and 9 show operations of an SOT-MRAM cell according to an embodiment of the present disclosure.

In a writing operation, a write current flows through the SOT induction wiring SOT. When writing a first type of data (e.g., "0") to the MTJ film stack 100, the word line WL and the write word line WWL are set to a first potential (e.g., ground or 0 V), and the source line SL is set to a write voltage Vw higher than a threshold voltage of the selector material layer 140. With this write voltage, the selector material layer 140 is turned on to flow a current from the source line SL to the write word line WWL through the SOT induction wiring SOT and the selector material layer 140. Since the FET 110 is off, no current flows through the MTJ film stack 100.

When writing a second type of data (e.g., "1") to the MTJ film stack 100, the word line WL is set to a second potential (e.g., Vdd) higher than the first potential, the source line SL is set to the first potential (e.g., ground or Vss), and the write word line WWL is set to the high voltage Vw. With this high voltage, the selector material layer 140 is turned on to flow a current from the write word line WWL to the source line SL through the SOT induction wiring SOT and the selector material layer 140. In other words, the current flow directions in the SOT induction wiring SOT are opposite to each other for the writing the first type data and the second type data. Since the FET 110 is off, no current flows through the MTJ film stack 100. During the write operations, the read bit line RBL is floating in some embodiments. The operation table shown in FIG. 9 can also be inversed according to the polarity of the spin Hall angle in some embodiments. Namely, the spin Hall angle can be either positive or negative and the write operations are opposite to each other.

When reading data from the MTJ film stack 100, the word line WL is set to the second potential, the source line SL is set to the first potential, and the read bit line RBL is set to the read voltage Vread. The amplitude of Vread is about ½ to about 1/50 of Vw in some embodiments. In other embodiments, the source line SL is set to the second potential. Since the FET 110 turns on, the read current flows from the source line SL to the read bit line RBL through the SOT induction wiring SOT and the MTJ film stack 100. In such a case, the Vread is lower than the source line voltage (e.g., Vread is negative). In other embodiments, the read current flows from the MTJ film stack 100 to the SOT induction wiring 15, in other words, from the read bit line RBL to the source line SL, so that the electrons flow from the free layer to the reference layer. The MTJ film stack 100 is more robust against read disturbance when the electrons flow from the free layer to the reference layer. In such a case, the Vread is higher than the source line voltage (e.g., Vread is positive). During the read operations, the write word line WWL is floating and the selector material layer is not turned on. In some embodiments, substantially no sneak (leak) current flows through the selector material layer 140 in the read operation. The sneak current is less than about 10 pA per cell in some embodiments.

In some embodiments, in the read operation, the source line SL connected to the target cell is set to Vdd and the source lines connected to the other cell are set to Vdd/2. The word line connected to the target cell is set to 0 V and the word lines connected to the other cells are set to Vdd/2. With this configuration, the sneak current can further be reduced.

Figure 10A:
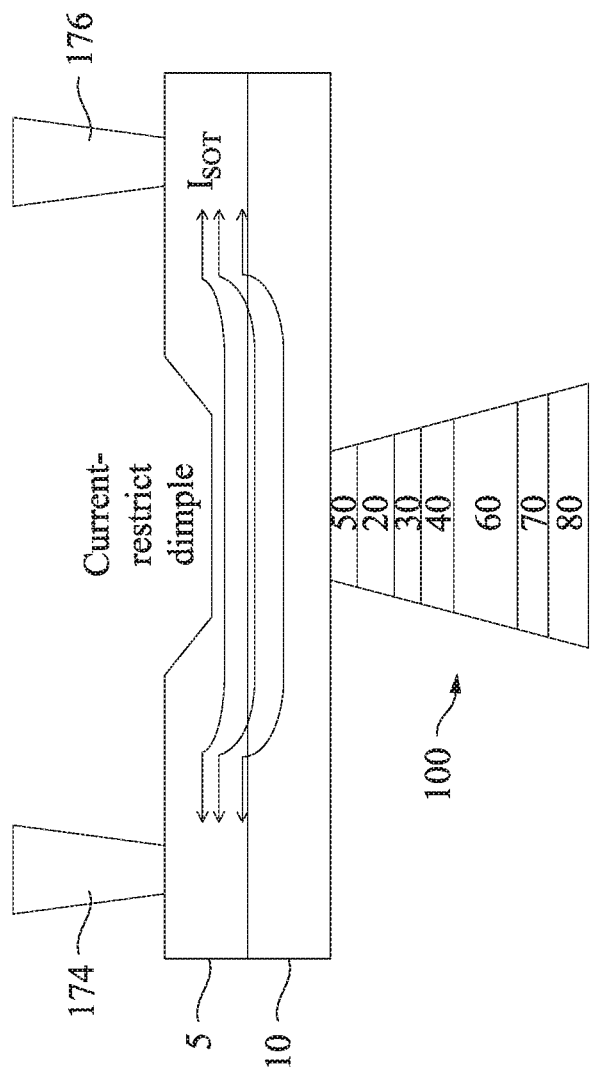
FIGS. 10A and 10B show structures of an SOT induction wiring according to embodiments of the present disclosure.

FIG. 10A is a cross sectional view of an SOT-MRAM cell according to an embodiment of the present disclosure.

In some embodiments, the top conductive layer 5 has a dimple (thin portion) above the MTJ film stack 100, where a thickness of the top conductive layer 5 is smaller than the remaining portion of the top conductive layer 5. This structure allows an increase in current flowing through the main SOT induction wiring layer 10 to cause a sufficient SOT effect, while allowing a low resistance between adjacent cells. In some embodiments, a thickness of the top conductive layer 5 is in a range from about 2 nm to 20 nm in some embodiments and is in a range from about 5 nm to 15 nm in other embodiments, and the thickness of the thin portion of the top conductive layer 5 is about 40% to about 80% of the thickness of the top conductive layer 5 at other than the thin portion.

Figure 10B:
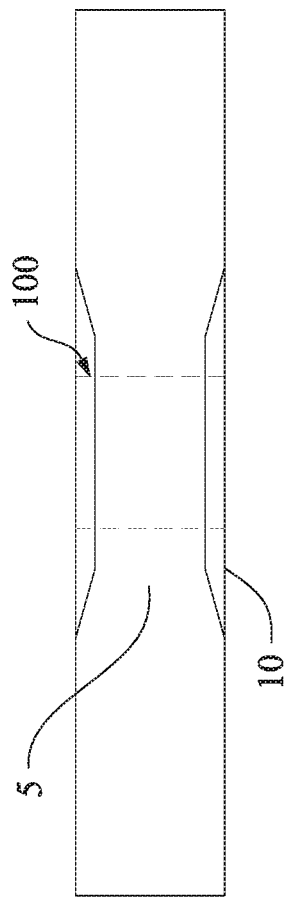

FIG. 10B is a plan view of an SOT-MRAM cell according to an embodiment of the present disclosure. In other embodiments, in addition to or instead of the dimple, a narrow portion, at which the width of the top conductive layer 5 is narrower above the MTJ film than the remaining portion of the top conductive layer 5, is provided. The width of the narrow portion of the top conductive layer 5 is about 50% to about 90% of the width of the top conductive layer 5 at other than the narrow portion.

FIGS. 11A-11K shows a sequential manufacturing operation for an SOT-MRAM cell according to the present disclosure. It is understood that in the sequential manufacturing process, one or more additional operations can be provided before, during, and after the stages shown in FIGS. 11A-11K, and some of the operations described below can be replaced or eliminated for additional embodiments of the method. The order of the operations/processes may be interchangeable. Materials, configurations, dimensions, processes and/or operations described with respect to FIGS. 1-10B may be employed in the following embodiments, and detailed explanation thereof may be omitted.

As shown in FIG. 11A, a hard mask structure 220 is formed over an n-th wiring layer including a metal wiring 210 embedded in an interlayer dielectric (ILD) layer 200. In some embodiments, n is 3, 4, 5 or 6. In some embodiments, the metal wiring 210 is made of Cu or a Cu alloy. In some embodiments, the hard mask layer 220 includes a first layer 222, a second layer 224 and a third layer 226. In some embodiments, the first to third layers are made of one of silicon oxide, silicon nitride, SiC, SiCN, aluminum oxide, zirconium oxide or any other suitable dielectric material. In certain embodiments, the first and third layers 222 and 226 are made of SiC and the second layer 224 is made of silicon oxide.

Then, the hard mask layer 220 is patterned to form an opening, so as to at least partially expose the upper surface of the metal wiring 210 by using one or more lithography and etching operations. A liner layer 230 is formed in the opening and a conductive layer 240 is formed over the liner layer 230, as shown in FIG. 11B. In some embodiments, the liner layer 230 is made of Ti, Ta or TaN and the conductive layer 240 is made TiN. After the conductive layer 240 is formed, a planarization operation, such as chemical mechanical polishing (CMP), is performed to form an electrode 240, as shown in FIG. 11C. The electrode 240 corresponds to the via 172 shown in FIGS. 4 and 5, in some embodiments.

Subsequently, layers for the MTJ film stack 100 is formed over the electrode 240 as shown in FIG. 11D. In FIGS. 11D-11K, the electrode 240, the metal wiring 210 and the ILD layer 200 are omitted. The layer for the MTJ film stack includes layers for a bottom electrode BE, a seed or buffer layer, a hard bias layer, a reference layer, a nonmagnetic spacer layer 30 (e.g., an MgO layer), a free layer and an interface layer. In some embodiments, a CMP stop layer and a hard mask layer HM are formed over the interface layer, in some embodiments. Each of the layers of the MTJ film stack can be formed by suitable film formation methods, which include physical vapor deposition (PVD) including sputtering; molecular beam epitaxy (MBE); pulsed laser deposition (PLD); atomic layer deposition (ALD); electron beam (e-beam) epitaxy; chemical vapor deposition (CVD); or derivative CVD processes further comprising low pressure CVD (LPCVD), ultrahigh vacuum CVD (UHVCVD), reduced pressure CVD (RPCVD); electro plating, or any combinations thereof.

Then, the stacked layers for the MTJ film are patterned into an MTJ film stack by using one or more lithography and etching operations, as shown in FIG. 11E. In some embodiments, as shown in FIG. 11E, the cross sectional view of the MTJ film stack 100 has a tapered (mesa) shape. Then, one or more dielectric material layers 205, such as silicon oxide, SiOC, SiOCN, SiCN, are formed to fully cover the MTJ film stack 100, as shown in FIG. 11F. A planarization operation, such as CMP, is performed to expose the uppermost layer of the MTJ film stack, as shown in FIG. 11G. Then, a conductive layer 250 for the main SOT induction wiring layer 10 and conductive layers 260 for the top conductive layer 5 (see, FIGS. 1, 10A and 10B) are formed as shown in FIG. 11H. In some embodiments, the conductive layers 260 includes a first conductive layer 262, a second conductive layer 264 as an etching stop layer and a third conductive layer 266. The second conductive layer 264 is made of a different material than the first and the third conductive layers. In some embodiments, no first conductive layer is formed.

Further, as shown in FIG. 11I, a photo resist pattern 270 is formed over the conductive layers 260, and the conductive layers 260 are patterned by using one or more lithography and etching operations, as shown in FIG. 11J. Then, the photo resist pattern 270 is removed as shown in FIG. 11K. In some embodiments, the etching stops at the second conductive layer 264. In other embodiments, an additional etching is performed so that the first conductive layer is partially etched. In some embodiments, before or after the patterning operations shown in FIGS. 11I-11K, the conductive layers 250 and 260 are patterned to form a line shaped pattern, and the thickness of the conductive layers 260 is reduced by the operations of FIGS. 11I-11K.

Figure 12A:
FIGS. 12A, 12B and 12C show various structures for an SOT induction wiring layer according to embodiments of the present disclosure.
Figure 12B:
Figure 12C:
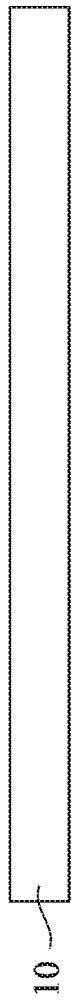

FIGS. 12A-12C shows various structures for the SOT induction wiring layer. In some embodiments, the main SOT induction wiring layer 10 is a single layer of heavy metal, such as Pt, W, Ta and Mo, as shown in FIG. 12A. In other embodiments, the SOT induction wiring layer 10' is a single layer of antiferromagnetic material, such as IrMn, as shown in FIG. 12B. In other embodiments, the SOT induction wiring layer 10" is a bi-layer of heavy metal layer 11 and an antiferromagnetic material layer 12, where the heavy metal layer 11 is in contact with the MTJ film stack, as shown in FIG. 12C.

FIGS. 13A-13F shows a sequential manufacturing operation for an SOT-MRAM according to the present disclosure. It is understood that in the sequential manufacturing process, one or more additional operations can be provided before, during, and after the stages shown in FIGS. 13A-13F, and some of the operations described below can be replaced or eliminated for additional embodiments of the method. The order of the operations/processes may be interchangeable. Materials, configurations, dimensions, processes and/or operations described with respect to FIGS. 1-12C may be employed in the following embodiments, and detailed explanation thereof may be omitted.

As shown in FIG. 13A, a first via 310 is formed in a first ILD layer 300. In some embodiments, the first via 310 corresponds to the via 174 shown in FIGS. 4 and 5. Then, a second ILD layer 320 is formed over the via 310 and the first ILD layer 300 as shown in FIG. 13B. Further, as shown in FIG. 13C, a hole or an opening 325 is formed by using one or more lithography and etching operations. Next, as shown in FIG. 13D, the opening 325 is filled with a selector material. In some embodiments, a selector material is formed by CVD, PVD and/or ALD in the opening 325 and over the upper surface of the second ILD layer 320, and then a CMP operation is performed to remove the excess layer formed on the upper surface of the second ILD layer 320. The selector material layer 330 corresponds to the selector material layer 140 shown in FIGS. 4 and 5. Subsequently, a third ILD layer 340 is formed as shown in FIG. 13E, and then a second via 350 is formed as shown in FIG. 13F. In some embodiments, the second via 350 corresponds to the via 175 shown in FIGS. 4 and 5.

Figure 14:
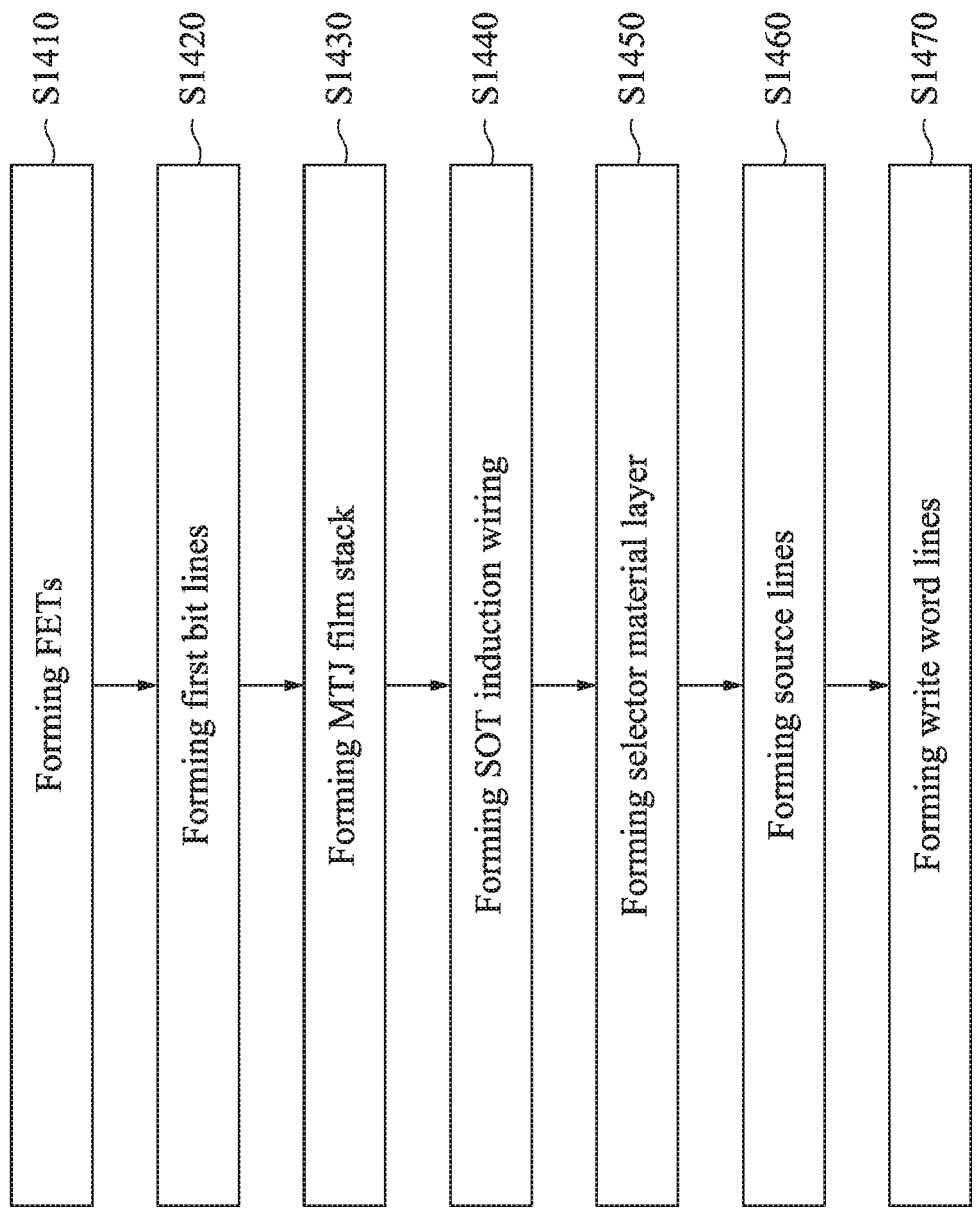
FIG. 14 is a flow chart showing a sequential manufacturing operation of an SOT-MRAM device.

FIG. 14 is a flow chart showing a sequential manufacturing operation of an SOT-MRAM device. It is understood that in the sequential manufacturing process, one or more additional operations can be provided before, during, and after the stages shown in FIG. 14, and some of the operations described below can be replaced or eliminated for additional embodiments of the method. The order of the operations/processes may be interchangeable. Materials, configurations, dimensions, processes and/or operations described with respect to FIGS. 1-13F may be employed in the following embodiments, and detailed explanation thereof may be omitted.

At S1410 of FIG. 14, transistors, such as FETs, are formed. The transistors includes switching transistors for SOT-MRAM cells and logic transistors for control and operations circuits. After one or more ILD layer are formed over the transistors, at S1420, bit lines are formed. The bit lines are made of one or more conductive material, such as Cu, W, Ni, Co, Ti or any other suitable material. In some embodiments, the bit lines are formed of local interconnects in direct contact with source/drain regions of the transistors. After one or more ILD layer are formed over the bit lines, at S1430, MTJ film stacks are formed, for example, by the operations explained with respect to FIGS. 11A-11G. Further, at 51440, SOT induction wirings are formed over the MTJ film stacks, respectively, for example, by the operations explained with respect to FIGS. 11H-11K. After one or more ILD layer are formed over the SOT induction wirings, at S1450, selector material layers are formed, for example, by the operations explained with respect to FIGS. 13A-13F. Further, the source lines are formed at 51460. In some embodiments, after one or more ILD layer are formed over the selector material layers, the source lines are formed. In other embodiments, source lines are formed at the same level as the selector material layers. Subsequently, after one or more ILD layer are formed over the selector material layers and the source lines, write word lines are formed at S1470.

In the present disclosure, a selector material layer is used as a switching device coupled to the SOT induction wiring, while an FET is used as a switching device coupled to the bottom of the MTJ film stack 100. Compared with the structure, in which a selector material layer is coupled to the bottom of the MTJ film stack and an FET is coupled to the SOT induction wiring, it is possible to suppress degradation of a tunnel magnetic resistance effect of the MTJ film stack, and to suppress read disturbance issues.

It will be understood that not all advantages have been necessarily discussed herein, no particular advantage is required for all embodiments or examples, and other embodiments or examples may offer different advantages.

In accordance with one aspect of the present disclosure, a magnetic memory device includes a magnetic tunnel junction (MTJ) stack, a spin-orbit torque (SOT) induction wiring disposed over the MTJ stack, a first terminal coupled to a first end of the SOT induction wiring, a second terminal coupled to a second end of the SOT induction wiring, and a selector layer coupled to the first terminal. In one or more of the foregoing and following embodiments, the magnetic memory device further includes a bottom electrode disposed below and coupled to the MTJ stack, and coupled to a switching device. In one or more of the foregoing and following embodiments, the MTJ stack includes a first magnetic layer, as a magnetic free layer, a non-magnetic spacer layer disposed under the first magnetic layer, and a second magnetic layer, as a magnetic reference layer, disposed under the non-magnetic spacer layer. The SOT induction wiring is disposed over the first magnetic layer. In one or more of the foregoing and following embodiments, the MTJ stack further includes an interfacial layer disposed between the first magnetic layer and the SOT induction wiring. In one or more of the foregoing and following embodiments, the first magnetic layer is $Fe_xCo_yB_{1-x-y}$, $0.50 \le x \le 0.70$ and $0.10 \le y \le 0.30$. In one or more of the foregoing and following embodiments, the second magnetic layer includes at least one of a layer of Co, Fe and B, and a layer of Fe and B. In one or more of the foregoing and following embodiments, the MTJ stack further includes a third magnetic layer below the second magnetic layer, the third magnetic layer having a different composition than the second magnetic layer. In one or more of the foregoing and following embodiments, the SOT induction wiring includes one or more layers of W, Ta, Mo and IrMn. In one or more of the foregoing and following embodiments, the SOT induction wiring includes a bottom layer made of W, Ta or Mo, and a top layer made of IrMn. In one or more of the foregoing and following embodiments, the selector layer includes $HfO_x$, where $0 < x < 2$.

In accordance with another aspect of the present disclosure, a magnetic memory includes a first word line, a bit line, a second word line, a source line, and a memory cell. The memory cell includes a magnetic tunnel junction (MTJ) stack, a spin-orbit torque (SOT) induction wiring coupled to one end of the MTJ stack, a first terminal coupled to a first end of the SOT induction wiring, a second terminal coupled to a second end of the SOT induction wiring and coupled to the source line, a third terminal coupled to another end of the MTJ stack, a selector layer coupled to the first terminal and coupled to the second word lines, and a switching transistor coupled to the third terminal and the bit line, a gate of the switching transistor being coupled to the first word line. In one or more of the foregoing and following embodiments, the source line is coupled to a current source. In one or more of the foregoing and following embodiments, the SOT induction wiring is disposed over the MTJ stack, the third terminal is disposed under the MTJ stack, and the switching transistor is disposed below the third terminal. In one or more of the foregoing and following embodiments, the bit line is located between the switching transistor and the third terminal along a vertical direction. In one or more of the foregoing and following embodiments, the selector layer is located between the SOT induction wiring and the second word line along a vertical direction. In one or more of the foregoing and following embodiments, the source line is located between the SOT induction wiring and the second word line along a vertical direction. In one or more of the foregoing and following embodiments, the source line is located between the selector layer and the second word line along the vertical direction.

In accordance with another aspect of the present disclosure, a magnetic memory includes a first word line, a second word line, a bit line, a write word line, a first source line, a second source line, a first memory cell, and a second memory cell. Each of the first and second memory cells includes a magnetic tunnel junction (MTJ) stack, a spin-orbit torque (SOT) induction wiring coupled to one end of the MTJ stack, a first terminal coupled to a first end of the SOT induction wiring, a second terminal coupled to a second end of the SOT induction wiring, a third terminal coupled to another end of the MTJ stack, a selector layer coupled to the first terminal and the write word line, and a switching transistor having a drain coupled to the third terminal and a source coupled to the bit line. The second terminal of the first memory cell is coupled to the first source line and the second terminal of the second memory cell is coupled to the second source line, and a gate of the first switching transistor is coupled to the first word line, and a gate of the second switching transistor is coupled to the second word line. In one or more of the foregoing and following embodiments, the SOT induction wiring is disposed over the MTJ stack, the third terminal is disposed under the MTJ stack, and the switching transistor is disposed below the third terminal. In one or more of the foregoing and following embodiments, the MTJ stack includes a first magnetic layer, as a magnetic free layer, a non-magnetic spacer layer disposed under the first magnetic layer, and a second magnetic layer, as a magnetic reference layer, disposed under the spacer layer. The SOT induction wiring is disposed over the first magnetic layer.

In accordance with another aspect of the present disclosure, in a method of operating the magnetic memory device as set forth above, a first type data is written into the MTJ film stack by flowing a current from the source line to the second word line via the selector material layer, while turning off the switching transistor.

In accordance with another aspect of the present disclosure, in a method of operating the magnetic memory device as set forth above, a second type data is written into the MTJ film stack by flowing a current from the second word line to the source line via the selector material layer, while turning off the switching transistor.

In accordance with another aspect of the present disclosure, in a method of operating the magnetic memory device as set forth above, a data is read from the MTJ film stack by turning on the switching transistor so that a current flows from the source line to the read bit line while turning off the selector material layer.

In accordance with one aspect of the present disclosure, in a method of manufacturing a magnetic memory, a switching transistor is formed over a substrate, a bit line is formed, a MTJ film stack is formed, an SOT induction wiring is formed over the MTJ film stack, a selector material layer is formed over the SOT induction wiring so that the selector material layer is coupled to one end of the SOT induction wiring, a source line is formed so that the source line is coupled to another end of the SOT induction wiring, and a second word line is formed above the selector material layer and the source line. In one or more of the foregoing and following embodiments, the MTJ film stack includes a first magnetic layer, as a magnetic free layer, a spacer layer disposed under the first magnetic layer, and a second magnetic layer, as a magnetic reference layer, disposed under the spacer layer. In one or more of the foregoing and following embodiments, the SOT induction wiring includes a bottom layer including one or more layers of W, Ta, Mo and IrMn and a top layer made of one or more of TiN, Ru Ti, TaN and Al, and a part of the top layer located over the MTJ film stack is trimmed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic memory device, comprising:
    a magnetic tunnel junction (MTJ) stack;
    a spin-orbit torque (SOT) induction wiring disposed over the MTJ stack;
    a first terminal coupled to a first end of the SOT induction wiring;
    a second terminal coupled to a second end of the SOT induction wiring; and
    a selector layer coupled to the first terminal.

2. The magnetic memory device of claim 1, further comprising:
    a bottom electrode disposed below and coupled to the MTJ stack, and coupled to a switching device.

3. The magnetic memory device of claim 2, wherein: the MTJ stack includes:
    a first magnetic layer, as a magnetic free layer;
    a non-magnetic spacer layer disposed under the first magnetic layer; and
    a second magnetic layer, as a magnetic reference layer, disposed under the spacer layer, and
    the SOT induction wiring is disposed over the first magnetic layer.

4. The magnetic memory device of claim 3, wherein the MTJ stack further includes an interfacial layer disposed between the first magnetic layer and the SOT induction wiring.

5. The magnetic memory device of claim 3, wherein the first magnetic layer is $Fe_xCo_yB_{1-x-y}$, $0.50 \leq x \leq 0.70$ and $0.10 \leq y \leq 0.30$.

6. The magnetic memory device of claim 5, wherein the second magnetic layer includes at least one of a layer of Co, Fe and B, and a layer of Fe and B.

7. The magnetic memory device of claim 3, wherein the MTJ stack further includes a third magnetic layer below the second magnetic layer, the third magnetic layer having a different composition than the second magnetic layer.

8. The magnetic memory device of claim 1, wherein the SOT induction wiring includes one or more layers of W, Ta, Mo and IrMn.

9. The magnetic memory device of claim 1, wherein the SOT induction wiring includes a bottom layer made of W, Ta or Mo, and a top layer made of IrMn.

10. The magnetic memory device of claim 1, wherein the selector layer includes $HfO_x$, where $0 < x < 2$.

11. A magnetic memory, comprising:
    a first word line; a bit line; a second word line; a source line; and a memory cell,
    wherein the memory cell includes:
        a magnetic tunnel junction (MTJ) stack;
        a spin-orbit torque (SOT) induction wiring coupled to one end of the MTJ stack;
        a first terminal coupled to a first end of the SOT induction wiring;
        a second terminal coupled to a second end of the SOT induction wiring and coupled to the source line;
        a third terminal coupled to another end of the MTJ stack;
        a selector layer coupled to the first terminal and coupled to the second word line; and
        a switching transistor coupled to the third terminal and the bit line, a gate of the switching transistor being coupled to the first word line.

12. The magnetic memory of claim 11, wherein the source line is coupled to a current source.

13. The magnetic memory of claim 11, wherein:
    the SOT induction wiring is disposed over the MTJ stack,
    the third terminal is disposed under the MTJ stack, and
    the switching transistor is disposed below the third terminal.

14. The magnetic memory of claim 13, wherein the bit line is located between the switching transistor and the third terminal along a vertical direction.

15. The magnetic memory of claim 13, wherein the selector layer is located between the SOT induction wiring and the second word line along a vertical direction.

16. The magnetic memory of claim 13, wherein the source line is located between the SOT induction wiring and the second word line along a vertical direction.

17. The magnetic memory of claim 16, wherein the source line is located between the selector layer and the second word line along the vertical direction.

18. A method of manufacturing a magnetic memory, comprising:
    forming a switching transistor over a substrate;
    forming a bit line over the substrate;
    forming a MTJ film stack over the substrate;
    forming an SOT induction wiring over the MTJ film stack;

forming a selector material layer over the SOT induction wiring so that the selector material layer is coupled to one end of the SOT induction wiring;

forming a source line so that the source line is coupled to another end of the SOT induction wiring; and forming a second word line above the selector material layer and the source line.

19. The method of claim 18, wherein the MTJ film stack includes:

a first magnetic layer, as a magnetic free layer;

a spacer layer disposed under the first magnetic layer; and a second magnetic layer, as a magnetic reference layer, disposed under the spacer layer.

20. The method of claim 19, wherein:

the SOT induction wiring includes a bottom layer including one or more layers of W, Ta, Mo and IrMn and a top layer made of one or more of TiN, Ru Ti, TaN and Al, and the method further comprises trimming a part of the top layer located over the MTJ film stack.

* * * * *